(12) United States Patent
Yu et al.

(10) Patent No.: US 6,200,869 B1
(45) Date of Patent: Mar. 13, 2001

(54) METHOD OF FABRICATING AN INTEGRATED CIRCUIT WITH ULTRA-SHALLOW SOURCE/DRAIN EXTENSIONS

(75) Inventors: Bin Yu, Fremont; Ming-Ren Lin, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,890

(22) Filed: Nov. 6, 1998

(51) Int. Cl.[7] .................................................. H01L 21/336
(52) U.S. Cl. ..................... 438/301; 438/303; 438/305; 438/306; 438/503; 438/528; 427/96
(58) Field of Search ..................................... 438/538, 563, 438/528, 503, 301, 303, 305, 306, 307; 427/96, 227, 229, 523, 531

(56) References Cited

U.S. PATENT DOCUMENTS

| | | | |
|---|---|---|---|
| 4,683,645 | * 8/1987 | Naguib et al. | 437/41 |
| 4,745,082 | 5/1988 | Kwok . | |
| 4,784,718 | 11/1988 | Mitani et al. . | |
| 5,264,382 | 11/1993 | Watanabe . | |
| 5,374,575 | 12/1994 | Kim et al. . | |
| 5,391,510 | 2/1995 | Hsu et al. . | |
| 5,393,685 | 2/1995 | Yoo et al. . | |
| 5,429,956 | 7/1995 | Shell et al. . | |
| 5,478,776 | * 12/1995 | Luftman et al. | 437/163 |
| 5,593,907 | 1/1997 | Anjum et al. . | |
| 5,607,884 | 3/1997 | Byun . | |
| 5,675,159 | 10/1997 | Oku et al. . | |
| 5,716,861 | 2/1998 | Moslehi . | |
| 5,793,090 | 8/1998 | Gardner et al. . | |
| 5,811,323 | 9/1998 | Miyasaka et al. . | |
| 5,825,066 | 10/1998 | Buynoski . | |
| 5,856,225 | 1/1999 | Lee et al. . | |
| 5,858,843 | 1/1999 | Doyle et al. . | |
| 5,915,182 | * 6/1999 | Wu | 438/239 |
| 6,004,852 | * 12/1999 | Yeh et al. | 438/303 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

IEDM Technical Digest International Electronic Device Meeting 1997 "Sub–100nm Gate Length Metal Gate NMOS Transistors Fabricated by a Replacement Gate Process" by Chatterjee, et al.1997 IEEE.

* cited by examiner

Primary Examiner—Brian K. Talbot
(74) Attorney, Agent, or Firm—Foley & Lardner

(57) ABSTRACT

A method of fabricating an integrated circuit with ultra-shallow source/drain junctions utilizes a solid-phase impurity source. The solid-phase impurity source can be a doped silicon dioxide layer approximately 300 nm thick. The structure is thermally annealed to drive dopants from the solid-phase impurity source into the source and drain regions. The dopants from the impurity source provide ultra-shallow source and drain extensions. The process can be utilized for P-channel or N-channel metal oxide field semiconductor effect transistors (MOSFETS).

20 Claims, 10 Drawing Sheets

METHOD OF FABRICATING AN INTEGRATED CIRCUIT WITH ULTRA-SHALLOW SOURCE/DRAIN EXTENSIONS

CROSS REFERENCE TO RELATED APPLICATIONS

This patent application is related to U.S. application Ser. No. 09/187,630, entitled "Dual Amorphization Implant Process for Ultra-Shallow Drain and Source Extensions", U.S. application Ser. No. 09/187,635 by Yu, et al., entitled "A Damascene Process for Forming Ultra-Shallow Source/Drain Extensions" now U.S. Pat. No. 5,985,726, and U.S. application Ser. No. 09/187,172, by Yu, entitled "Recessed Channel Structure for Manufacturing Shallow Source Drain Extension" all filed on an even date herewith and assigned to the assignee of the present invention.

FIELD OF THE INVENTION

The present invention relates to integrated circuits and methods of manufacturing integrated circuits. More particularly, the present invention relates to a method of manufacturing integrated circuits having transistors with ultra-shallow source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier lowering. Shallow source and drain extensions and, hence, controlling short-channel effects, are particularly important as transistors become smaller.

Conventional techniques utilize a double implant process to form shallow source and drain extensions. According to the conventional process, the source and drain extensions by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide or silicon nitride spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, transistors with physical gate lengths smaller than 100 nm should have ultra-shallow source and drain extensions (less than 30 nanometer (nm) junction depth) according to 1997 national semiconductor technology load map. Forming source and drain extensions with junction depths of less than 30 nm is very difficult using conventional fabrication techniques. Conventional ion implantation and diffusion doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically in to the bulk semiconductor substrate.

Thus, there is a need for a method of manufacturing ultra-shallow source and drain extensions that does not utilize a conventional double implant process. Further still, there is a need for transistors that have ultra-shallow junction source and drain extensions. Even further still, there is a need for an efficient method of manufacturing source and drain extensions.

SUMMARY OF THE INVENTION

The present invention relates to a method of manufacturing an integrated circuit that includes depositing a solid phase impurity source and thermally annealing a substrate. The solid phase impurity source is provided over a gate structure disposed on the semiconductor substrate. The substrate is thermally annealed to drive a dopant from the solid phase impurity source into the semiconductor substrate, thereby forming source and drain extensions.

The present invention still further relates to a method of manufacturing an ultra-large scale integrated (ULSI) circuit. The integrated circuit includes a plurality of field effect transistors having shallow source and drain extensions. The method includes the steps of forming at least part of a gate structure on a top surface of a semiconductor substrate, depositing a doped silicon dioxide over the top surface of the semiconductor substrate, and thermally annealing the substrate. Thermally annealing the substrate drives a dopant from the doped silicon dioxide into the semiconductor substrate, thereby forming source and drain extensions having a thickness or junction depth less than 30 nanometers (nm).

The present invention further still relates to a method of providing a plurality of ultra-shallow drain/source extensions for field effect transistors associated with an ultra-large scale integrated circuit. The method includes forming at least a portion of a gate structure on a top surface of a silicon substrate, depositing a solid phase impurity source over the top surface, and driving dopants from the impurity source into the substrate to form the ultra-shallow drain/source extensions.

DETAILED DESCRIPTION OF THE PREFERRED EXEMPLARY EMBODIMENTS

Figure 1:
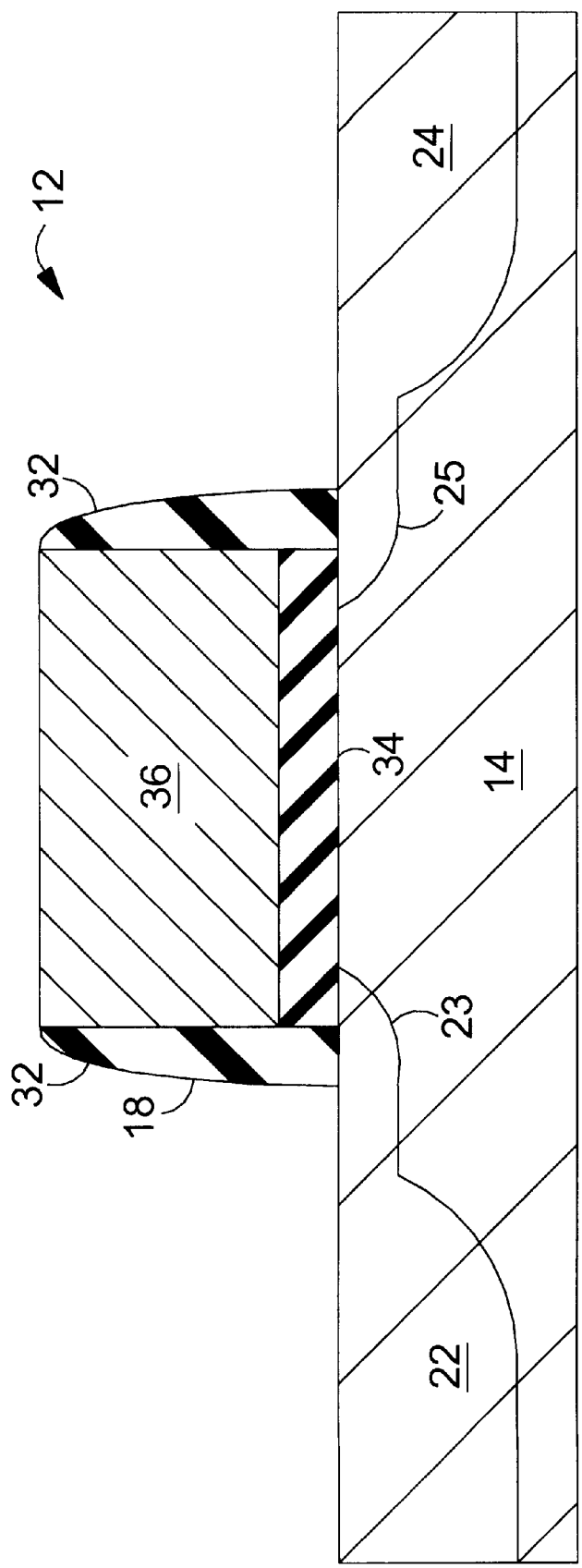
FIG. 1 is a cross-sectional view of a portion of an integrated circuit having a transistor with shallow source/drain extensions in accordance with an exemplary embodiment of the present invention.

With reference to FIG. 1, a transistor 12 is disposed on a semiconductor substrate 14, such as, a single crystal silicon wafer. Transistor 12 is part of an integrated circuit (IC) manufactured on a wafer (such as, a silicon wafer). Transistor 12 includes a gate structure 18, a source region 22, and a drain region 24. Transistor 12 also includes a drain extension 25 and a source extension 23.

Extensions 23 and 25 are preferably ultra-shallow extensions (e.g., junction depth less than 30 nanometers (nm)), which are thinner than regions 22 and 24. Extensions 23 and 25 are connected to regions 22 and 24, respectively, and are disposed partially underneath a gate oxide 34.

Transistor 12 can be an N-channel or a P-channel field effect transistor, such as, a metal oxide semiconductor field effect transistor (MOSFET). Transistor 12 is preferably part of an ultra-large scale integrated (ULSI) circuit that includes one million or more transistors.

Gate structure 18 includes a spacer 32, gate oxide 34, and a polysilicon gate conductor 36. Gate oxide 34 is preferably thermally grown on substrate 14. Spacer 32 and conductor 36 are preferably deposited by chemical vapor deposition (CVD) and etched to form the particular structures for transistor 12. Spacer 32 is preferably silicon nitride ($Si_3N_4$).

Ultra-shallow extensions 23 and 25 help transistor 12 achieve substantial immunity to short channel effects. Short channel effects can degrade performance of transistor 12 as well as the manufacturability of the IC associated with transistor 12.

Figure 2:
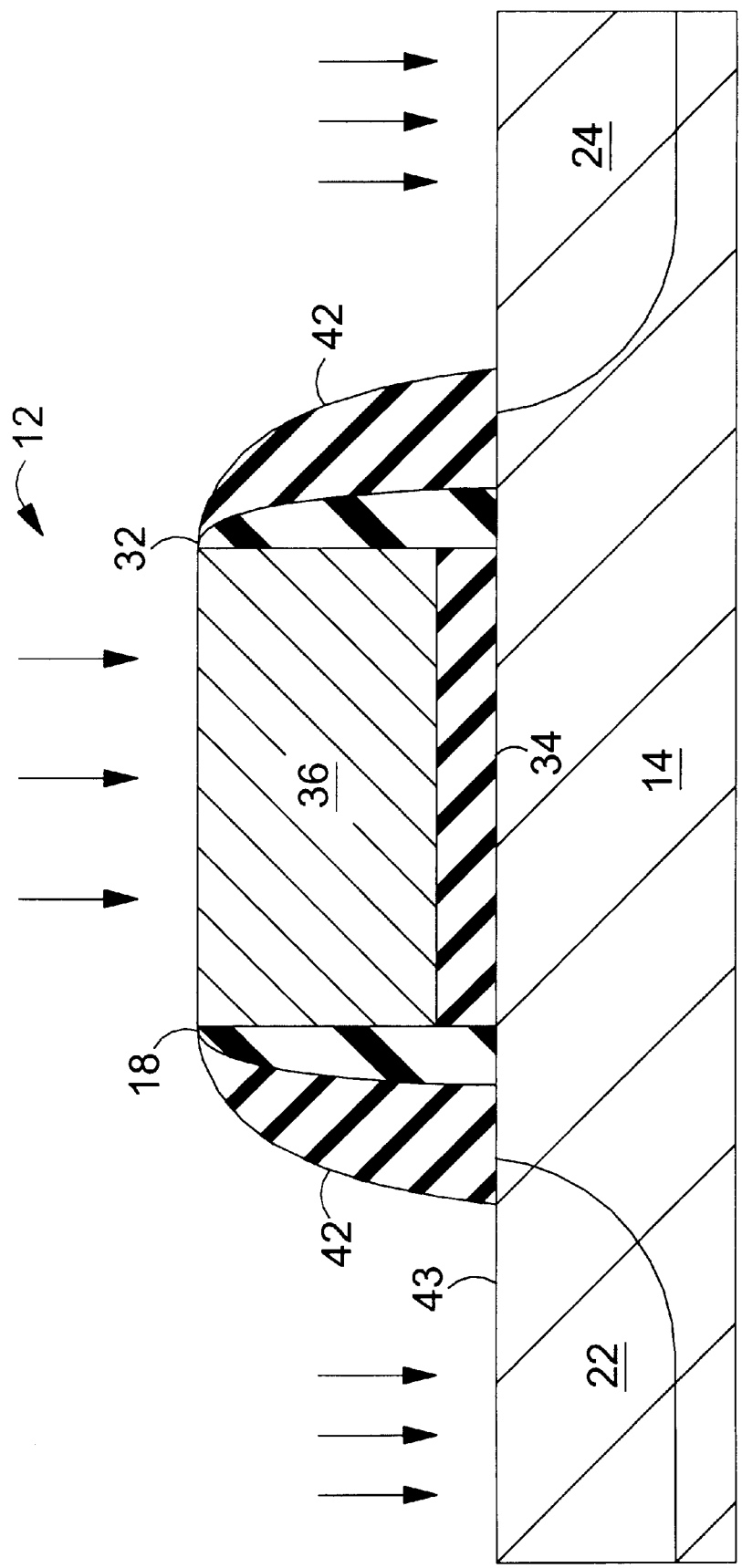
FIG. 2 is a cross-sectional view of the portion of the integrated circuit illustrated in FIG. 1 showing a source and drain doping step.

With reference to FIGS. 1–5, the fabrication of transistor 12, including source extension 23 and drain extension 25 is described below as follows. In FIG. 2, transistor 12 can be substantially formed by conventional semiconductor processing techniques to form gate structure 18 including gate oxide 34, gate conductor 36, source region 22, and drain region 24. Additionally, spacers 42 are provided partially over source region 22 and drain region 24. Spacers 42 are a second spacer with respect to spacers 32. Spacers 42 abut against spacers 32. Spacers 42 are preferably formed by depositing silicon dioxide over gate structure 18 (including spacer 32) and by selectively etching the silicon dioxide to leave spacer 42.

Spacers 32 have a width (left to right) of approximately 10–20 nanometers (nm), and spacers 42 preferably have a width of approximately 50–80 nm. After spacers 42 are provided, substrate 14 is doped in an ion implantation process to form source region 22 and drain region 24. Regions 22 and 24 extend deeply below a top surface 43 of substrate 14 (FIG. 2). Source region 22 and drain region 24 can be heavily doped with boron or phosphorous, depending upon the type of transistor 12. Alternatively, other dopants, such as, arsenic, boron diflouride, indium, and antimony can be utilized. Additionally, conductor 36 is polysilicon and is preferably doped at the same time that source region 22 and drain region 24 are doped. Substrate 14 is subject to a rapid thermal annealing process to appropriately activate the implanted dopants within conductor 36 and substrate 14.

Figure 3:
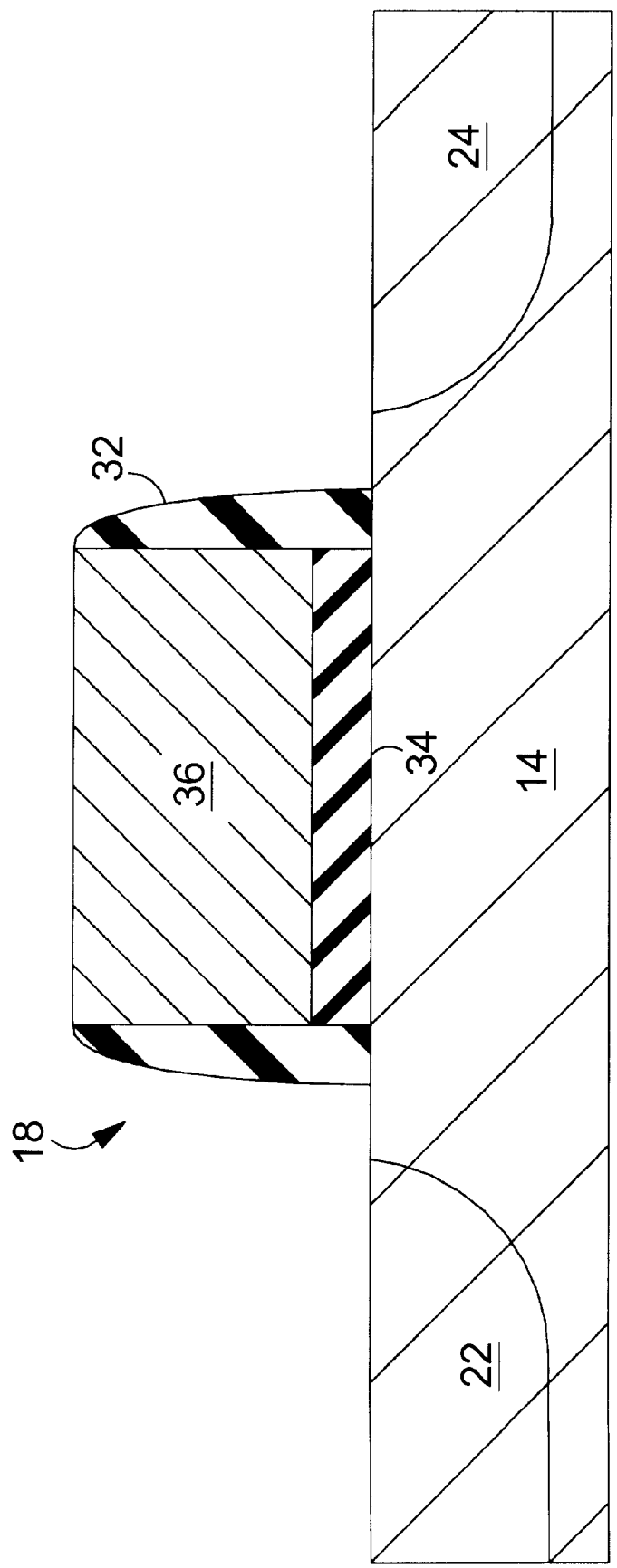
FIG. 3 is a cross-sectional view of the portion of the integrated circuit illustrated in FIG. 1, showing an oxide spacer removal step.

In FIG. 3, spacers 42 are stripped from structure 18 by a dry-etching process, such as, a reactive ion etching (RIE) process. The dry-etching process is preferably selective to silicon dioxide with respect to silicon and silicon nitride, thereby leaving spacer 32 on structure 18 and not affecting other portions of substrate 14. Alternatively, other stripping for removal processes can be utilized.

Figure 4:
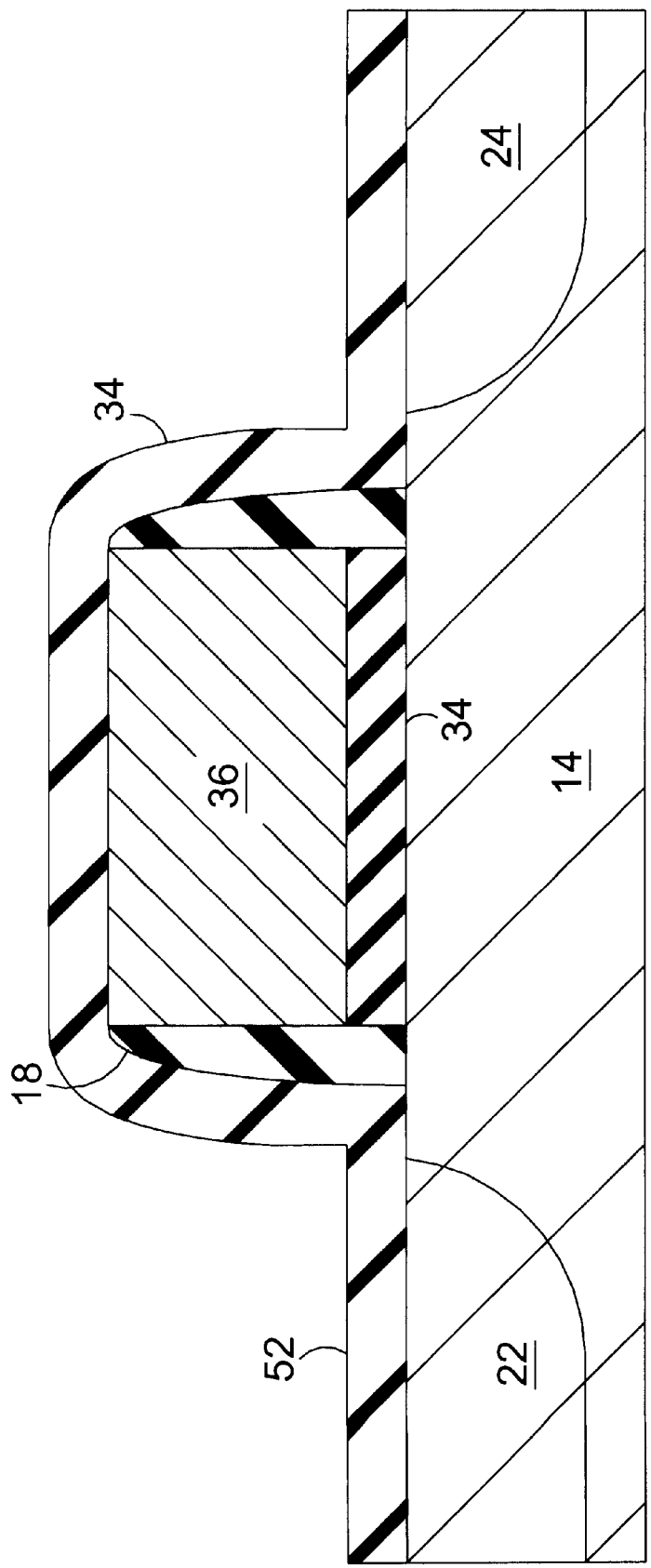
FIG. 4 is a cross-sectional view of the portion of the integrated circuit illustrated in FIG. 1, showing a solid phase impurity source deposition step.
Figure 5:
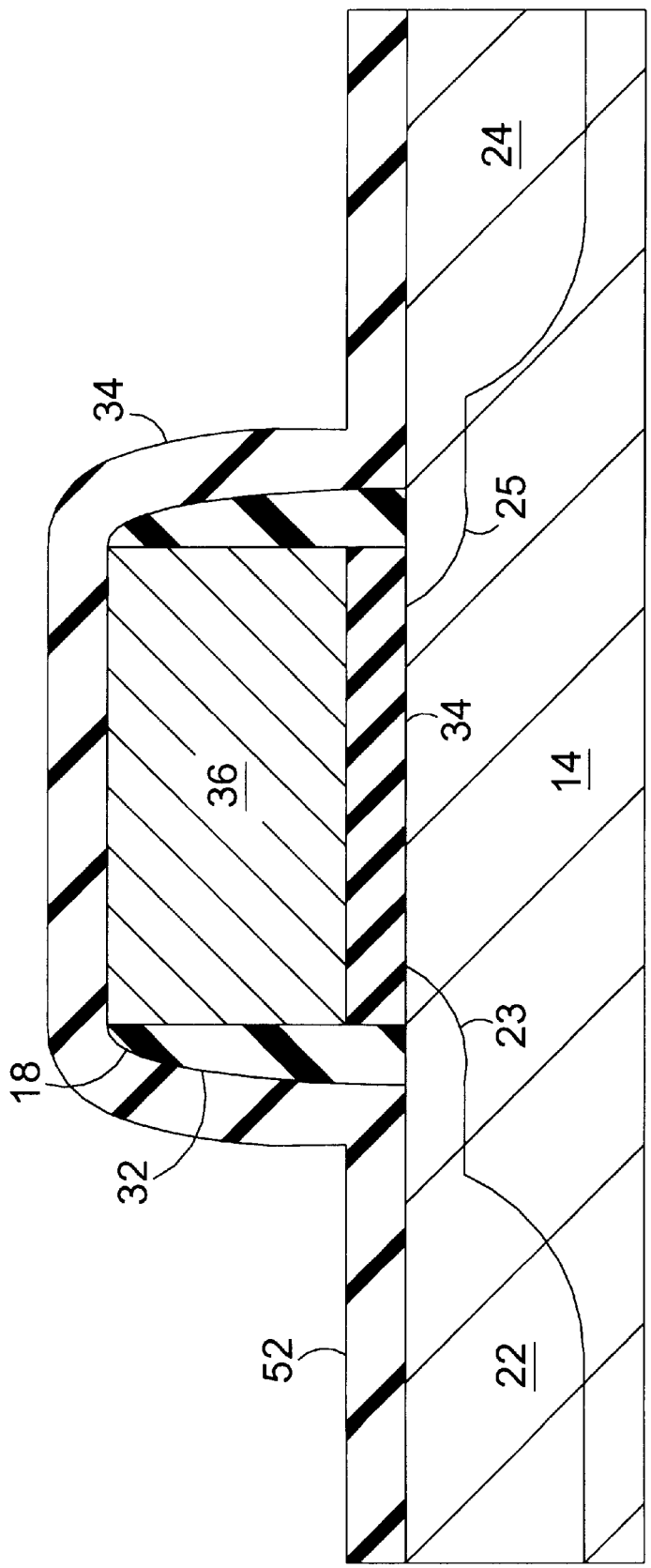
FIG. 5 is a cross-sectional view of the portion of the integrated circuit illustrated in FIG. 1, showing a furnace annealing step.

With reference to FIG. 4, a solid-phase impurity source 52 is provided over gate structure 18 and substrate 14, after spacers 42 are stripped. Impurity source 52 is preferably a 300 nm thick layer of doped silicon dioxide. Impurity source 52 can be heavily doped with phosphorous (PSG) for N-channel MOSFETS or doped with boron (BSG) for P-channel MOSFETS. Impurity source 52 can be deposited by a chemical vapor deposition (CVD) process or by a spin-on process.

Furthermore, with reference to FIG. 4, substrate 14 is subject to a furnace annealing process at a temperature of approximately 900° C. The furnace annealing process can be a rapid thermal annealing process where substrate 14 is heated in a chamber. Pulse-like heating or laser operations can be utilized to efficiently drive dopants from impurity source 52. The furnace annealing process drives dopants from impurity source 52 into gate conductor 36, source region 22, and drain region 24. Additionally, dopants are driven into substrate 14 to form source extension 23 and drain extension 25. Therefore, impurity source 52 provides dopants for highly doping source and drain extensions 23 and 25. At the same time, more dopants are driven into source region 22, drain region 24, and gate conductor 36.

With reference to FIG. 1, source 52 (shown in FIG. 4) can be stripped from substrate 14, and conventional fabrication processes can be utilized to form contacts, interconnections, and other transistor structures for transistor 12. Nitride spacer 32 protects gate oxide 34 from being undercut during the stripping process. The stripping process can be a plasma dry etch process or chemical wet etch selective to silicon dioxide.

With reference to FIGS. 1–5, the advantageous process forms ultra-shallow source and drain extensions 23 and 25, respectively, by dopant diffusion from solid-phase impurity source 52. The dopant diffusion is performed by utilizing solid-phase impurity source 52 and thermal annealing to form extensions 23 and 25; negative effects caused by conventional ion implantation, such as, implant channeling effect and point defect generation, are not present in transistor 12. Since the deep source and drain junctions associated with regions 22 and 24 are formed by conventional ion implantation techniques and annealed before the formation of shallow source and drain extensions, the thermal budget for extensions 23 and 25 is very small, which is helpful for the formation of ultra-shallow extensions 23 and 25. Spacers 42 and 32 (the double-spacer structure shown in FIG. 2) can be utilized to precisely adjust the distance between deep source and drain regions 22 and 24, respectfully, and the edge of gate structure 18.

Figure 6:
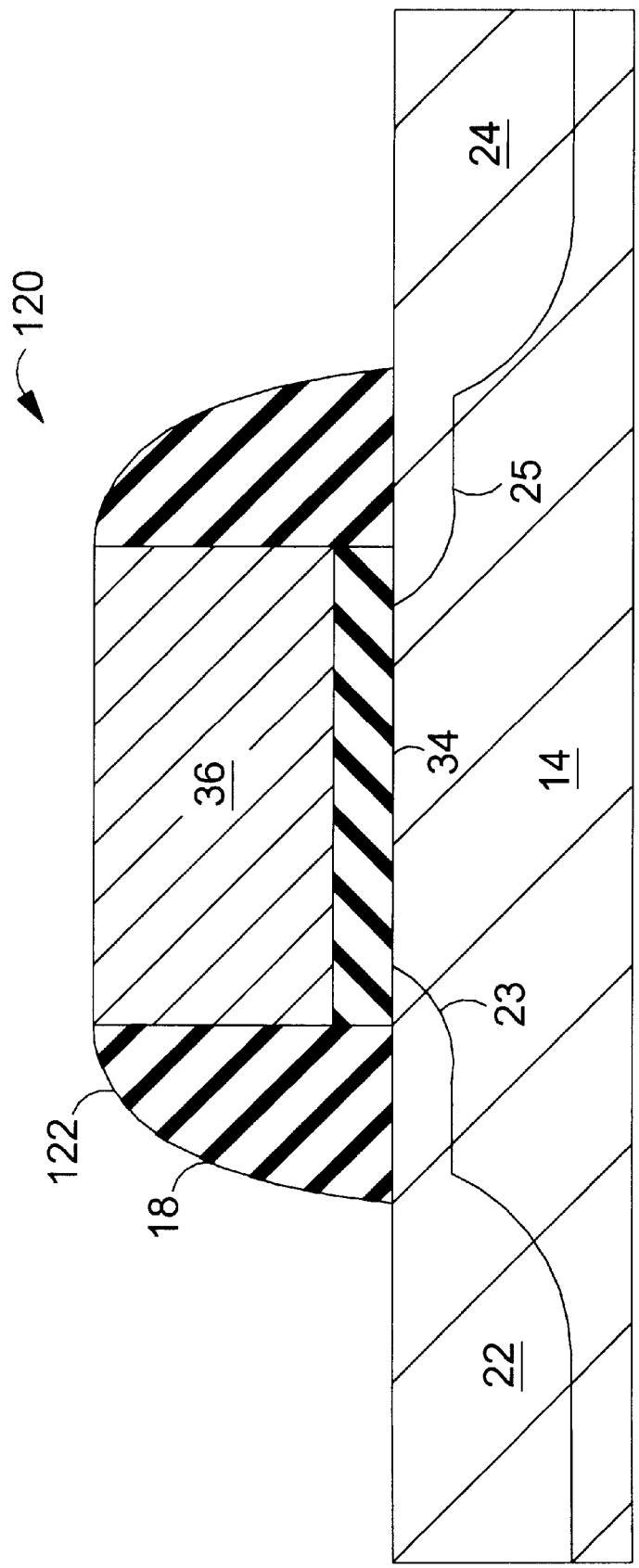
FIG. 6 is a cross-sectional view of a portion of the integrated circuit having transistors with shallow source and drain extensions in accordance with another exemplary embodiment of the present invention.

With reference to FIG. 6, a transistor 120 is substantially similar to transistor 12, wherein like numerals denote like elements. Transistor 120 is disposed on substrate 14. However, gate structure 18 includes spacers 122. Spacers 122 are thicker than spacers 32, discussed with reference to FIG. 1. Spacers 122 are preferably an 80–100 nm wide silicon nitride (Si3N4) spacers. The fabrication of transistor 120 is described below with reference to FIGS. 6–10.

Figure 7:
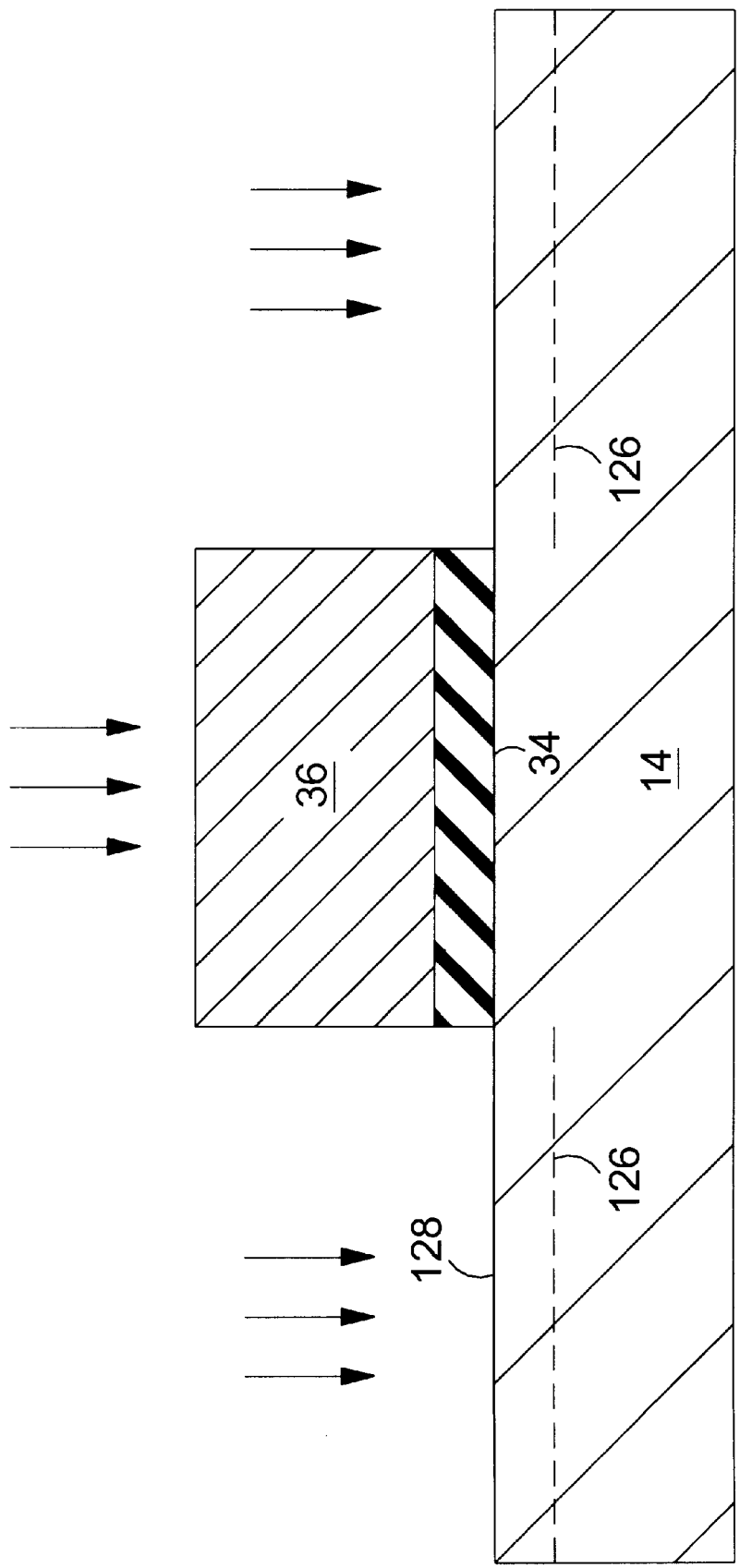
FIG. 7 is a cross-sectional view of the portion of the integrated circuit illustrated in FIG. 6, showing a pre-amorphization implant step.

In FIG. 7, gate conductor 36 is a polysilicon gate conductor provided on gate oxide 34. After gate conductor 36 and gate oxide 34 are formed on substrate 14, substrate 14 is subjected to a shallow semiconductor pre-amorphization implant. The pre-amorphization implant is preferably provided to a level of 30–40 nm below a top surface 128 of substrate 14. The implant is preferably a silicon or germanium ion implantation process with a dose of $3\times10^{14}$ to $1\times10^{15}$ dopants per $cm^2$.

Silicon and germanium ions can be charged up to 10–100 kiloelectron volts (keVs) and implanted into substrate 14. The ions may be implanted by any type of implantation device used in conventional planting processes, e.g., Varian E220, Varian E100, or Vista 80, Manufactured by the Varian Corporation, Palo Alto, Calif., the AMT 9500 device, manufactured by Applied Material, Inc., or the Genius 1520, manufactured by Genius Corp.

The pre-amorphization implant changes the crystal nature of substrate 14 to be an amorphous crystal structure above a boundary 126 (30–40 nm below top surface 128 of substrate 14). Conductor 36 and gate oxide 34 protect the channel underneath gate structure 18 from the pre-amorphization implant. Alternatively, the implant can be constrained to the region associated with extensions 23 and 25.

Figure 8:
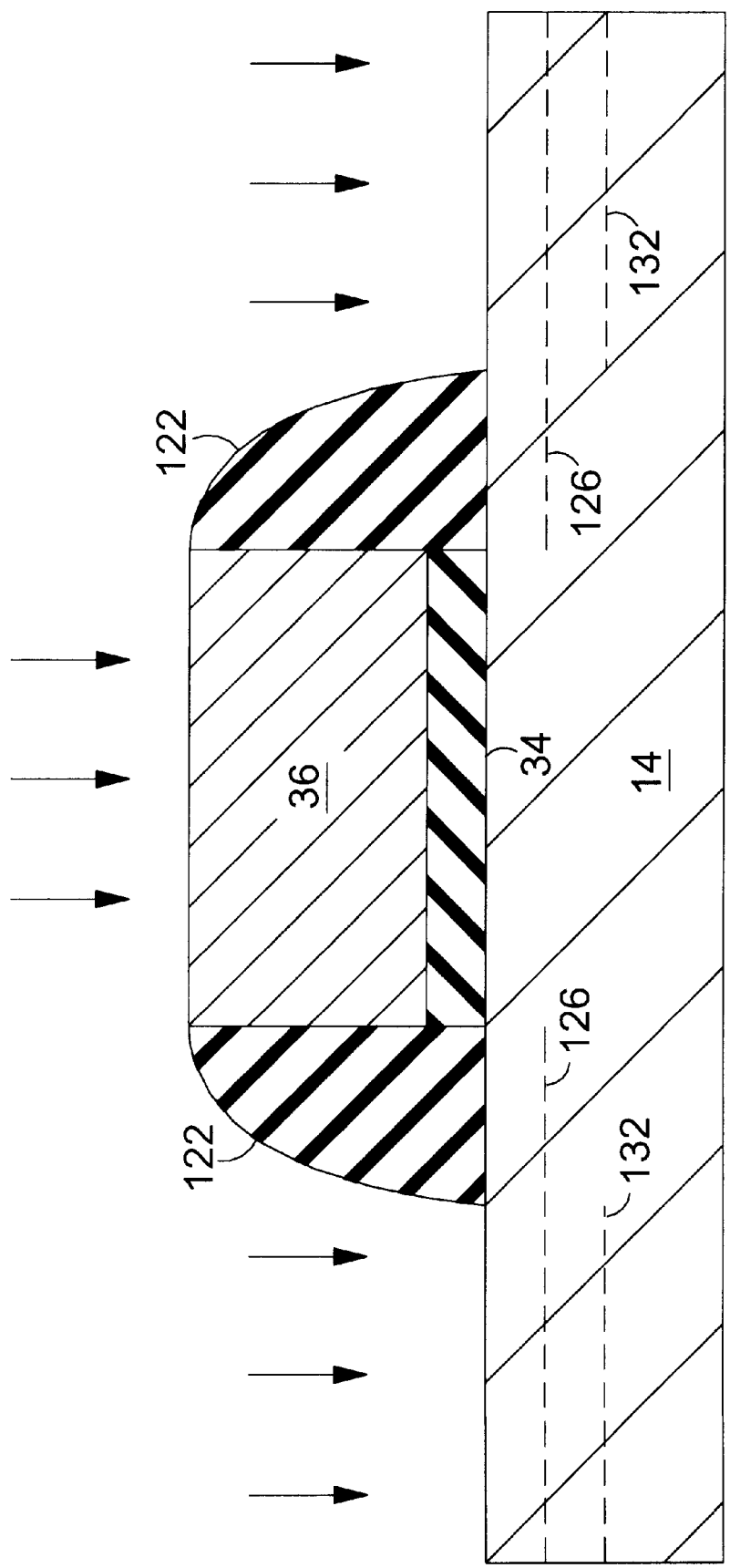
FIG. 8 is a cross-sectional view of the portion of the integrated circuit illustrated in FIG. 6, showing a nitride spacer formation step.

With reference to FIG. 8, spacers 122 are formed as a layer of CVD-deposited silicon nitride that is etched to leave spacers 122. After spacers 122 are formed, a deep semiconductor pre-amorphization implant is provided to define source region 22 and drain region 24. The deep pre-amorphization implant can be an ion implantation process similar to the process described above using silicon or germanium ions, but with higher energy. The pre-amorphization implant amorphizes the silicon of substrate 14 to a boundary 132 (approximately 80 nm below surface 128).

Figure 9:
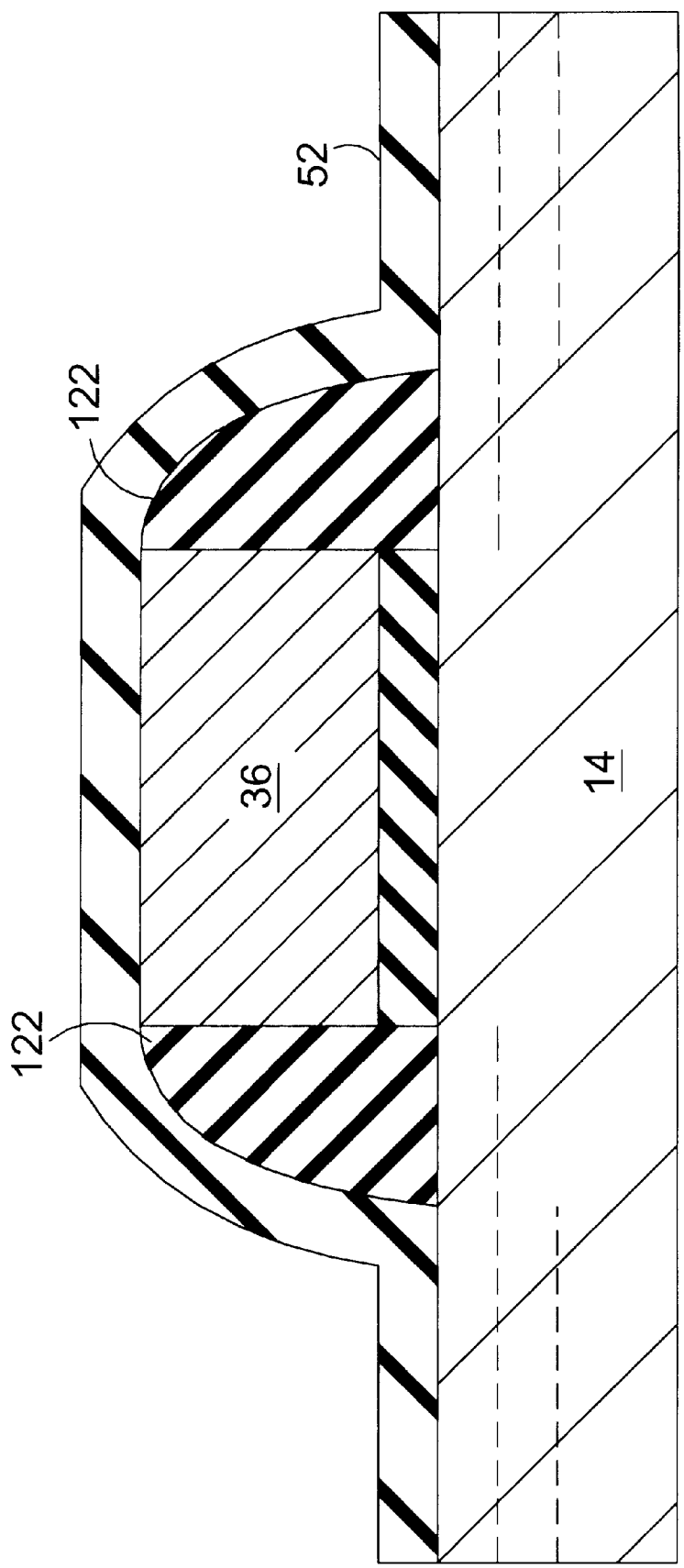
FIG. 9 is a cross-sectional view of the portion of the integrated circuit illustrated in FIG. 6, showing a solid phase impurity source deposition step.
Figure 10:
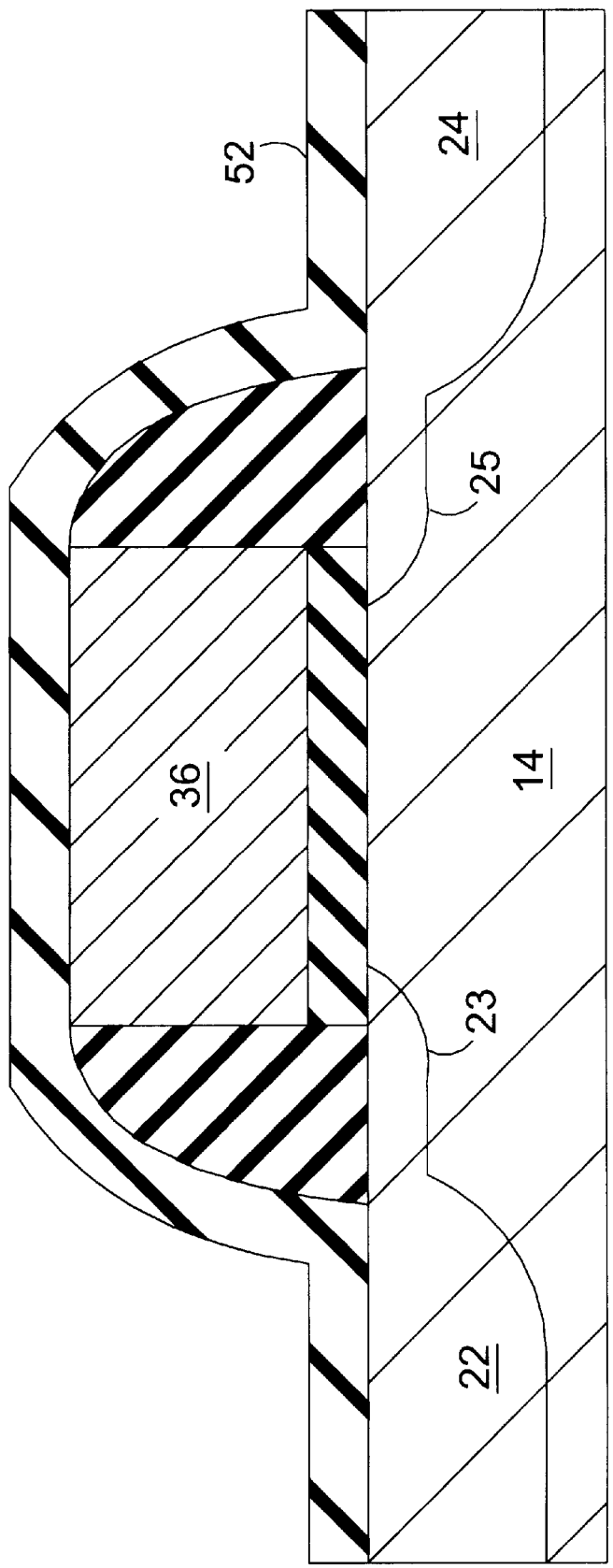
FIG. 10 is a cross-sectional view of the integrated circuit illustrated in FIG. 6, showing a furnace annealing step.

With reference to FIG. 9, a solid-phase impurity source 52 is provided as a 300 nm thick doped silicon dioxide layer. In FIG. 10, substrate 14 is heated by furnace annealing (e.g., 900° C.) to drive dopants from source 52 into substrate 14. The dopant concentration extends to boundaries 126 and 132 of the amorphous silicon, thereby forming extensions 23 and 25 and source region 22 and drain region 24. Additionally, conductor 36 receives dopants from source 52. In FIG. 6, impurity source 52 (shown in FIGS. 9 and 10) is stripped and conventional transistor processes are utilized to complete the formation of transistor 120.

The double semiconductor (Si or Ge) pre-amorphization implant (PAI) process amorphizes the region where both the deep source and drain regions 22 and 24, respectfully, and shallow extensions 23 and 25 are formed. Dopant from impurity source 52 is distributed more evenly in the amorphized silicon regions than in the single crystal silicon regions. By adjusting PAI conditions, the depth of the ultra-shallow extensions 23 and 25 can be accurately controlled.

Lower sheet resistance can be obtained in regions 23 and 25 where box-like dopant profiles are provided via the double pre-amorphization implant process. Spacers 122 are advantageously comprised of nitride so impurity source 52 can be stripped without causing an undercut of the thin gate oxide 34.

It is understood that, while preferred embodiments, examples, materials, and values are given, they are for the purpose of illustration only. The apparatus and method of the invention is not limited to the precise details and conditions disclosed. For example, although two fabrication methods utilizing solid-phase impurity sources are discussed, other methods could utilize the principles of the present invention to create ultra-shallow source and drain extensions. Thus, changes may be made to the details disclosed without departing from the spirit of the invention, which is defined by the following claims.

What is claimed is:

1. A method of manufacturing an integrated circuit, comprising:

providing a gate structure having a first pair of spacers and a second pair of spacers, the first pair of spacers being closer to a gate conductor than the second pair of spacers;

doping a semiconductor substrate to form deep source and drain regions;

removing the second pair of spacers;

depositing a solid phase impurity source over the semiconductor substrate and the gate structure;

thermally annealing the substrate to drive a dopant from the solid phase impurity source into the semiconductor substrate, thereby forming source and drain extensions, wherein the doping the semiconductor substrate step is performed before the depositing the solid phase impurity source step.

2. The method of claim 1 wherein the doping the semiconductor substrate step utilizes boron or phosphorous.

3. The method of claim 2 wherein the first pair of spacers is a different material than the second pair of spacers.

4. The method of claim 3, wherein the first pair of spacers includes nitrogen, and the second pair of spacers includes silicon dioxide.

5. The method of claim 4, wherein the second pair of spacers are stripped before the depositing step and after the doping step in a dry etching process.

6. The method of claim 1, wherein the solid phase impurity source comprises boron.

7. The method of claim 1, wherein the solid phase impurity source comprises phosphorous.

8. The method of claim 1 further comprising:

providing a first amorphization implant before the depositing step.

9. The method of claim 8 wherein the first spacers include silicon nitride.

10. The method of claim 9 wherein the second spacers include silicon dioxide.

11. The method of claim 10, wherein the source and drain regions are doped with boron.

12. The method of claim 10, wherein the semiconductor substrate includes silicon.

13. A method of manufacturing an ultra-large scale integrated circuit including a plurality of field effect transistors having shallow source and drain extensions, the method comprising the steps of:

forming at least part of a gate structure on a top surface of a semiconductor substrate, the gate structure having a first pair of spacers and a second pair of spacers, the first pair of spacers being closer to a gate conductor than the second pair of spacers;

doping the semiconductor substrate to form deep source and drain regions;

removing the second pair of spacers;

depositing a solid phase impurity over the top surface of the semiconductor substrate; and thermally annealing the substrate to drive a dopant from the solid phase impurity into the semiconductor substrate, thereby forming source and drain extensions having a thickness of less than 30 nm, wherein the depositing the solid phase impurity step is Performed after the doping the semiconductor substrate step.

14. The method of claim 13, wherein the solid phase impurity comprises silicon dioxide doped with phosphorous or boron.

15. The method of claim 13, wherein the gate structure includes silicon nitride.

16. The method of claim 13, wherein the thermal annealing step heats the substrate to approximately 900° C.

17. The method of claim 13, wherein the part includes at least a polysilicon conductor and a gate oxide.

18. A method of providing a plurality of ultra-shallow drain/source extensions for field effect transistors associated with an ultra-large scale integrated circuit, the method comprising the following steps in the following order:

forming at least a portion of a gate structure on a top surface of a silicon substrate having a first pair of spacers and a second pair of spacers, the first pair of spacers being closer to a gate conductor than the second pair of spacers;

doping the semiconductor substrate to form deep source and rain regions;

removing the second pair of spacers;

depositing a solid phase impurity source over the top surface and the gate structure; and driving dopants from the impurity source into the substrate to form the ultra-shallow drain/source extensions.

19. The method of claim 18, wherein the driving is performed by heating the substrate.

20. The method of claim 18, wherein the solid phase impurity source is doped silicon dioxide.

* * * * *